United States Patent
Ushikubo

(10) Patent No.: US 7,178,074 B2
(45) Date of Patent: Feb. 13, 2007

(54) METHOD FOR TESTING FUNCTIONAL CIRCUIT BLOCK

(75) Inventor: Masanori Ushikubo, Yamanashi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 739 days.

(21) Appl. No.: 10/307,401

(22) Filed: Dec. 2, 2002

(65) Prior Publication Data

US 2003/0105991 A1 Jun. 5, 2003

(30) Foreign Application Priority Data

Dec. 5, 2001 (JP) ............................. 2001/371925

(51) Int. Cl.
*G01R 31/28* (2006.01)
(52) U.S. Cl. ..................................... 714/724
(58) Field of Classification Search ............... 714/724, 714/742, 33, 741, 726, 727, 729; 326/16; 365/201; 324/73.1; 702/108, 117, 122; 716/4
See application file for complete search history.

(56) References Cited

U.S. PATENT DOCUMENTS

| | | | | |
|---|---|---|---|---|
| 5,161,160 A | * | 11/1992 | Yaguchi et al. | 714/729 |
| 5,673,274 A | * | 9/1997 | Yoshida | 714/724 |
| 6,625,784 B1 | * | 9/2003 | Ohta et al. | 716/4 |
| 6,763,485 B2 | * | 7/2004 | Whetsel | 714/726 |

* cited by examiner

*Primary Examiner*—Shelly Chase
(74) *Attorney, Agent, or Firm*—Volentine Francos & Whitt, PLLC

(57) ABSTRACT

A method for testing a plurality of functional circuit blocks of a system LSI, including dividing the plurality of functional circuit blocks into at least a first test group and a second test group, wherein the first test group is tested before the second test group and wherein testing of a functional circuit block in the second test group is started immediately after testing of a functional circuit block in the first test group is finished.

9 Claims, 15 Drawing Sheets

METHOD FOR TESTING FUNCTIONAL CIRCUIT BLOCK

BACKGROUND OF THE INVENTION

1. Field of the Invention

The present invention relates, in general, to testing techniques and, more particularly, to a method for testing a plurality of functional circuit blocks, wherein each of the functional circuit blocks is designed as an existing semiconductor integrated circuit.

This claims priority under 35 USC §119 to Japanese patent application Serial Number 371925/2001, filed Dec. 5, 2001, the subject matter of which is incorporated herein by reference in its entirely for all purposes.

2. Description of the Related Art

In recent years, a system LSI comprises many functional circuit blocks. The functional circuit block which is a core of the system LSI, is called as intellectual property (IP), macro cell or so on. The IP is a block which is designed in the state of hardware or software and executes a specific operation.

A conventional method for testing the functional circuit blocks in the system LSI sets a plurality of test groups each comprising a plurality of the functional circuit blocks to be tested simultaneously, using a combination of a parallel access method and a serial access method. The conventional method tests the test groups in turn. The concept of the parallel access method is shown in FIG. 14. As shown in FIG. 14, each of the input and output terminals of each of IP 1401 and 1402 connects with the outer terminals of the system LSI 1400 with one-one relation. The parallel access method tests a plurality of IP parallel using the outer terminals of the system LSI, by inputting a signal to IP from the outer terminals directly and observing an output signal output by the outer terminals directly. The concept of the serial access method is shown in FIG. 15. As shown in FIG. 15, there are a serial-parallel converter 1501 and a parallel-serial converter 1502 between the outer terminals of the system LSI 1500 and the input and output terminals of IP 1503 and 1504. The serial access method tests a plurality of IP serially using the outer terminals of the system LSI, by inputting a signal to IP from the outer terminals through the serial-parallel converter 1501 and observing an output signal output by the outer terminals through the parallel-serial converter 1502.

An operation of the conventional method for testing the functional circuits in the system LSI will be described with reference to FIG. 16. The vertical axis shows the range of the number of pins of the system LSI necessary for testing. The horizontal axis shows test time necessary for testing. Six functional circuit blocks IP(A)–IP(F) are shown in FIG. 16. A vertical length of each functional circuit block is indicative of the number of pins of the system LSI necessary for testing. A horizontal length of each functional circuit block is indicative of test time necessary for testing.

The conventional test method divides the functional circuit blocks into a plurality of test groups. In FIG. 16, the functional circuit blocks are divided into four test groups. A first test group comprises the functional circuit blocks IP(A) and IP(B). A second test group comprises the functional circuit blocks IP(C) and IP(D). A third test group comprises the functional circuit block IP(E). A fourth test group comprises the functional circuit block IP(F).

The conventional test method tests the functional circuit blocks by test groups. First, the first test group is tested. Next, the second test group is tested, after the test in the first test group is finished. Correspondingly, the third test group is tested, after the test in the second test group is finished. The fourth test group is tested, after the test in the third test group is finished.

However, each of the functional circuit blocks in each test group does not always have the same test time as the other functional circuit blocks in the corresponding test group. The test time of the functional circuit block IP(A) is longer than that of the functional circuit block IP(B). The non-used pins of the system LSI for testing exist uselessly, from the time of finishing the test in the functional circuit block IP(A) until finishing the test in the functional circuit block IP(B). The testing of the second test group can not start immediately after the test of the functional circuit block IP(B) is finished, because the test in the functional circuit block IP(A) has not been finished yet. Therefore, the conventional test method does not use the non-used pins of the system LSI effectively.

SUMMARY OF THE INVENTION

According to one aspect of the present invention, there is provided a method for testing a plurality of the functional circuit blocks in the system LSI, the method comprising dividing a plurality of the functional circuit blocks into at least a first test group and a second test group, wherein the first test group is tested before the second test group, and starting testing of one functional circuit block in the second test group immediately after one functional circuit block in the first test group is finished being tested.

The novel features of the invention will more fully appear from the following detailed description, appended claims and the accompanying drawings.

DETAILED DESCRIPTION OF THE PREFERRED EMBODIMENTS

A method for testing functional circuit blocks of the present invention will be explained with reference to the preferred embodiments of the present invention. Moreover, not all the combinations of the characteristics of the present invention described in the embodiments are essential to the problem solving means of the present invention.

Figure 1:
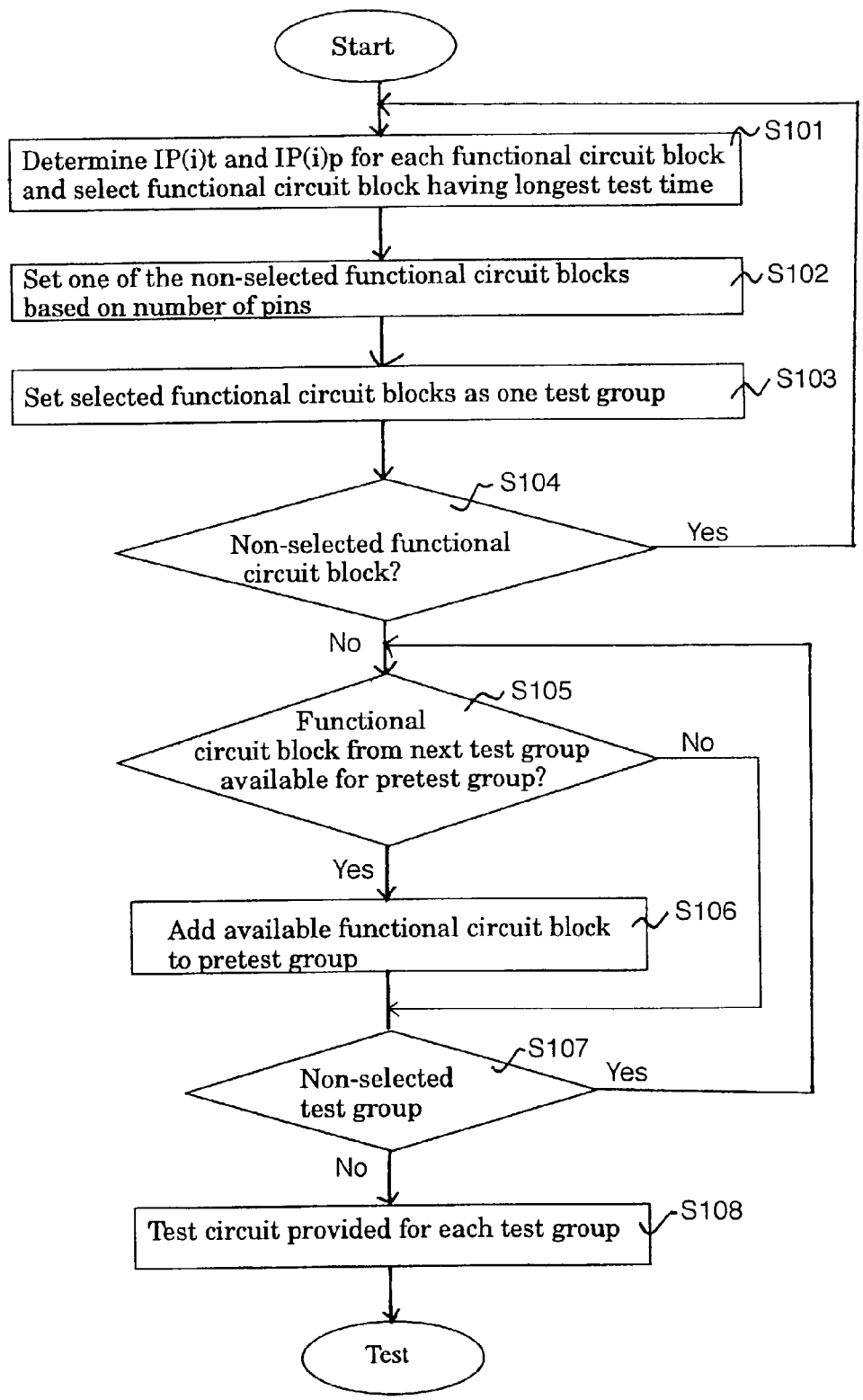
FIG. 1 is an operational diagram showing a method for testing functional circuit blocks according to a first preferred embodiment of the present invention.
Figure 2:
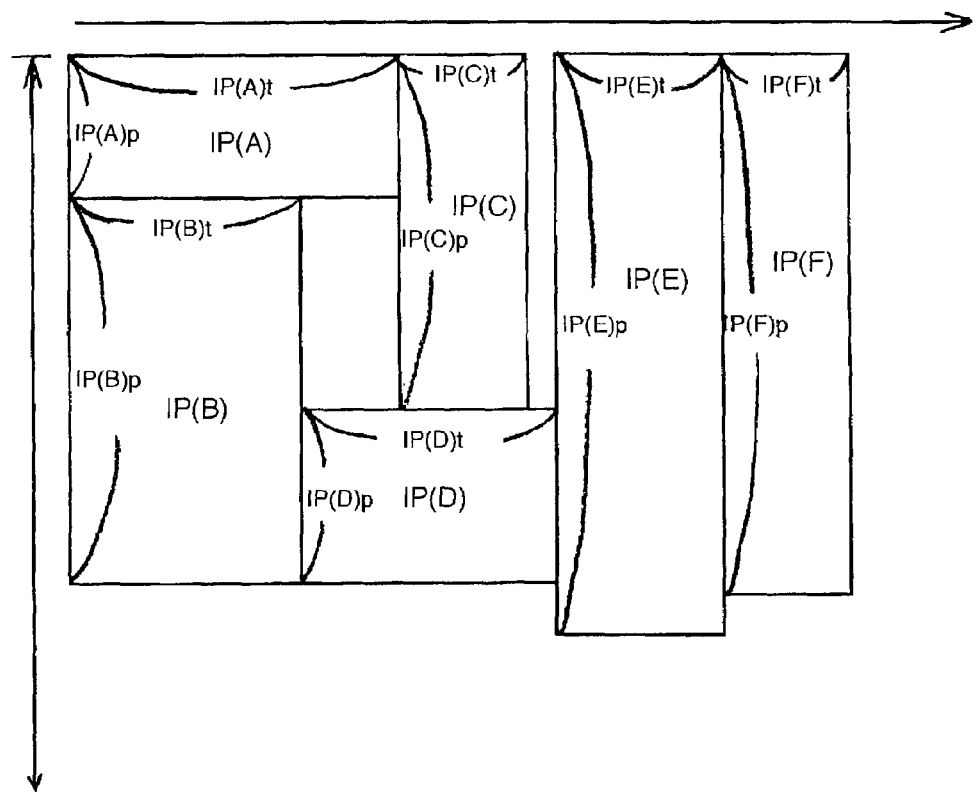
FIG. 2 is a block diagram showing the number of LSI pins and testing time according to the first preferred embodiment of the present invention.
Figure 3:
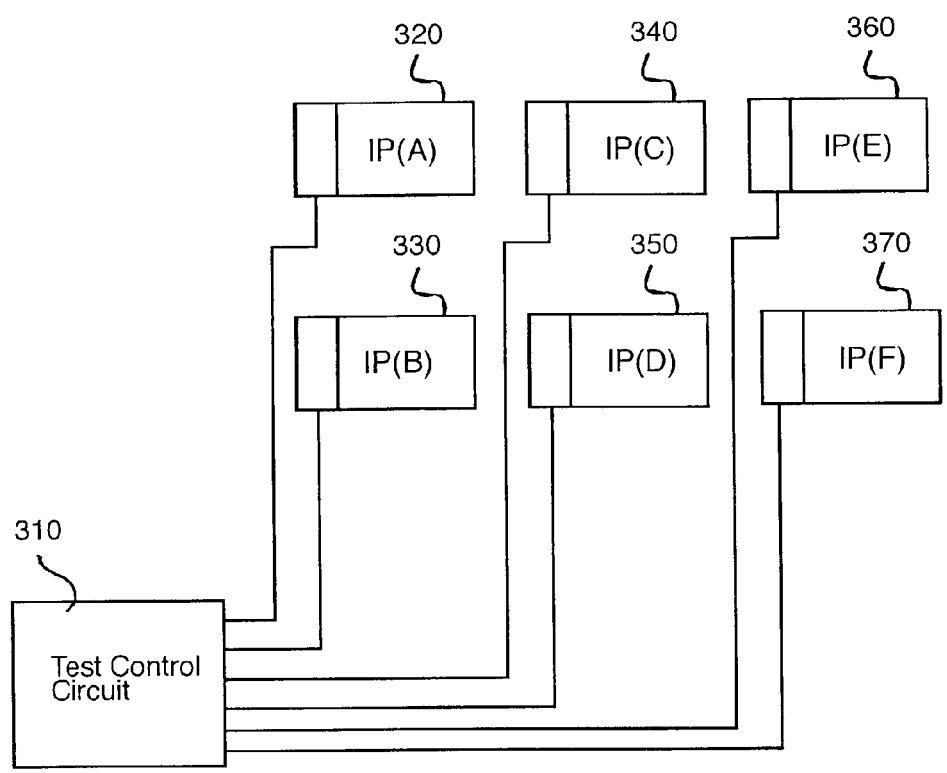
FIG. 3 is a block diagram showing a test circuit according to the first preferred embodiment of the present invention.
Figure 4:
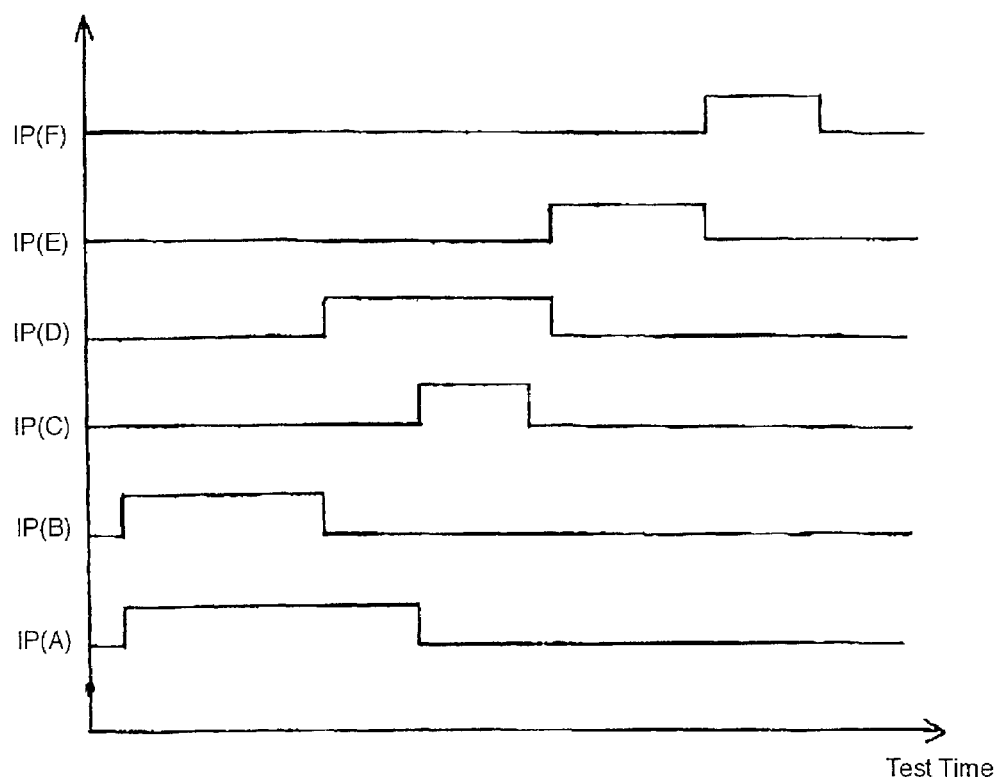
FIG. 4 is a timing chart showing necessary time for testing each functional circuit block shown in FIG. 2.

A method for testing the functional circuit blocks according to a first preferred embodiment of the present invention will be described with reference to FIGS. 1–4. FIG. 1 is an operational diagram showing the method for testing the functional circuit blocks according to the first preferred embodiment of the present invention. FIG. 2 is a block diagram showing the number of LSI pins and testing time according to the first preferred embodiment of the present invention. FIG. 3 is a block diagram showing a test circuit according to the first preferred embodiment of the present invention. FIG. 4 is a timing chart showing time necessary for testing each functional circuit block shown in FIG. 2.

First, an operation of the method for testing the functional circuit blocks according to the first preferred embodiment of the present invention will be explained with reference to FIGS. 1 and 2. In FIG. 2, the vertical axis P shows the range of the number of pins of the system LSI which are available for testing the functional circuit blocks. The horizontal axis T shows test time to finish testing in the functional circuit blocks. The functional circuit blocks are shown as IP(i). IP(i)t shows test time necessary for testing the functional circuit block IP(i) and IP(i)p shows the number of pins of the system LSI necessary for testing.

In step S101, each test time necessary for testing each functional circuit block and each of the number of pins of the system LSI necessary for testing each functional circuit blocks, are determined. In FIG. 2, each test time IP(A)t–IP(F)t and each of the number of pins IP(A)p–IP(F)p are determined. In addition, in step S101, the functional circuit block having the longest test time among the functional circuit blocks, is selected. In FIG. 2, the functional circuit block IP(A) having test time IP(A)t is selected. As shown in FIG. 2, test time IP(A)t has the longest horizontal length.

In step S102, one of the functional circuit blocks is selected from among the non-selected functional circuit blocks of step S101 in consideration of the number of pins of the system LSI which are available for starting testing in parallel with the functional circuit block selected in step S101. In FIG. 2, the functional circuit block IP(B) is selected. The following relationship is considered:

$$P=IP(A)p+IP(B)p+\Delta P1 \quad [1],$$

wherein $\Delta P1$ is the number of unused pins of the LSI when the functional circuit blocks IP(A) and IP(B) are simultaneously tested. The smaller the value $\Delta P1$ is, the more efficient the method for testing becomes. The other functional circuit blocks IP(C)–IP(F) are not selected, because testing of the other functional circuit blocks IP(C)–IP(F) can not be started with the functional circuit block IP(A) at the same time out of consideration of the number of pins of the system LSI. Also, if for example the functional circuit block IP(D) is selected instead of the functional circuit block IP(B), $\Delta P2$ (=P–IP(A)p–IP(D)p) is larger than $\Delta P1$. The method for testing becomes inefficient if the functional circuit block IP(D) is selected in step S102 instead of functional circuit block IP(B).

In step S103, the functional circuit blocks selected in steps S102 and S103 are set as one test group. These set functional circuit blocks can be tested by the parallel access method at the same time. In FIG. 2, the functional circuit blocks IP(A) and IP(B) are set as one test group (1st test group).

In step S104, it is determined whether there is a non-selected functional circuit block or not. If there is a non-selected functional circuit block, steps S101–S103 are repeated. If not, step S105 is executed. In FIG. 2, the functional circuit blocks IP(C) and IP(D) are set as one test group (2nd test group). The functional circuit block IP(E) is set as one test group (3rd test group) and the functional circuit block IP(F) is set as one test group (4th test group). In FIG. 2, there are four test groups.

By the way, in the 1st test group, test time IP(B)t is shorter than test time IP(A)t. So, the test process for the functional circuit block IP(B) is finished faster than the test process for the functional circuit block IP(A). When the test process for the functional circuit block IP(B) is finished, the number of non-used pins $\Delta P3$ (=P–IP(A)p)>$\Delta P1$ exists until the test process for the functional circuit block IP(A) is finished.

So, in step S105, it is determined whether there is a functional circuit block among the next test group which is available as a pretest group for starting to test using the non-used pins of the system LSI during the test process of the first test group. If such a functional circuit block is determined as available in step S105, step S106 is executed, and if not, step S107 is executed. In more detail with reference to FIG. 2, according to the relationship between the 1st test group and the 2nd test group, the functional circuit block IP(D) in the 2nd test group is available for starting to test using the non-used pins of the system LSI during the test process for the 1st test group. So, the functional circuit block IP(D) is selected out of consideration for the test time. Usually, the functional circuit block having the longest test time is selected.

In step S106, the functional circuit block which is selected in step S105, is added to the pre-test-group. Therefore, immediately after the test process for one functional circuit block in the first test group is finished, the test process for the functional circuit block which is selected in step S105 in the pretest group is started. In FIG. 2, the functional circuit block IP(D) is selected as in the pretest group and is thus added to the 1st test group. Therefore, immediately after the test process for the functional circuit block IP(B) is finished, the test process for the functional circuit block IP(D) is started.

In step S107, it is determined whether there is a non-selected test group or not. If there is a non-selected test group, steps S105 and S106 are executed. If not, step S108 is executed. In FIG. 2, there are a 3rd test group and a 4th test group. Steps S105 and S106 are executed for the 3rd test group and 4th test group.

In step S108, a test circuit is provided for each test group as shown in FIG. 3. The test circuit has a test control circuit 310 and the functional circuit blocks 320–370. The test control circuit 310 and the functional circuit blocks 320–370 are connected to each other by the control bus. Each of the functional circuit blocks 320–370 is controlled through the control bus by the test control circuit 310. In addition, the test control circuit 310 has a test access circuit and so on. As shown in FIG. 3, each functional circuit block is tested by the parallel access method. Returning to FIG. 3, the test process for the functional circuit blocks is executed.

In FIG. 4, each wave form shows the testing status of each functional circuit block. The rising part of the wave form shows the status of being tested. The falling part of the wave shows the status of not being tested. As shown in FIG. 4, the test process for the functional circuit blocks IP(A) and IP(B) are started at the same time. Next, immediately after the test process for the functional circuit block IP(B) is finished, the test process for the functional circuit block IP(D) is started. Next, immediately after the test process for the functional circuit block IP(A) is finished, the test process for the functional circuit block IP(C) is started. Next, immediately after the test process for the functional circuit blocks IP(C) and IP(D) is finished, the test process for the functional circuit block IP(E) is started. Next, immediately after the test process for the functional circuit block IP(E) is finished, the test process for the functional circuit block IP(F) is started. Therefore, total test time is the sum of IP(B)t, IP(D)t, IP(E)t and IP(F)t. On the other hand, total test time of the conventional test method is the sum of IP(A)t, IP(D)t, IP(E)t and IP(F)t. Thus, total test time of the first preferred embodiment of the present invention is shorter than total test time of the conventional test method by the difference between IP(A)t and IP(B)t.

The method for testing the functional circuit blocks according to the first preferred embodiment of the present invention starts to test next test group without waiting for finishing all of test processes of the previous test group. The method for testing the functional circuit blocks according to the first preferred embodiment of the present invention saves the time necessary for finishing all of the test processes of the previous test group. Therefore, the method for testing the functional circuit blocks according to the first preferred embodiment of the present invention reduces test time for the functional circuit blocks of the system LSI in comparison with the conventional method.

Figure 5:
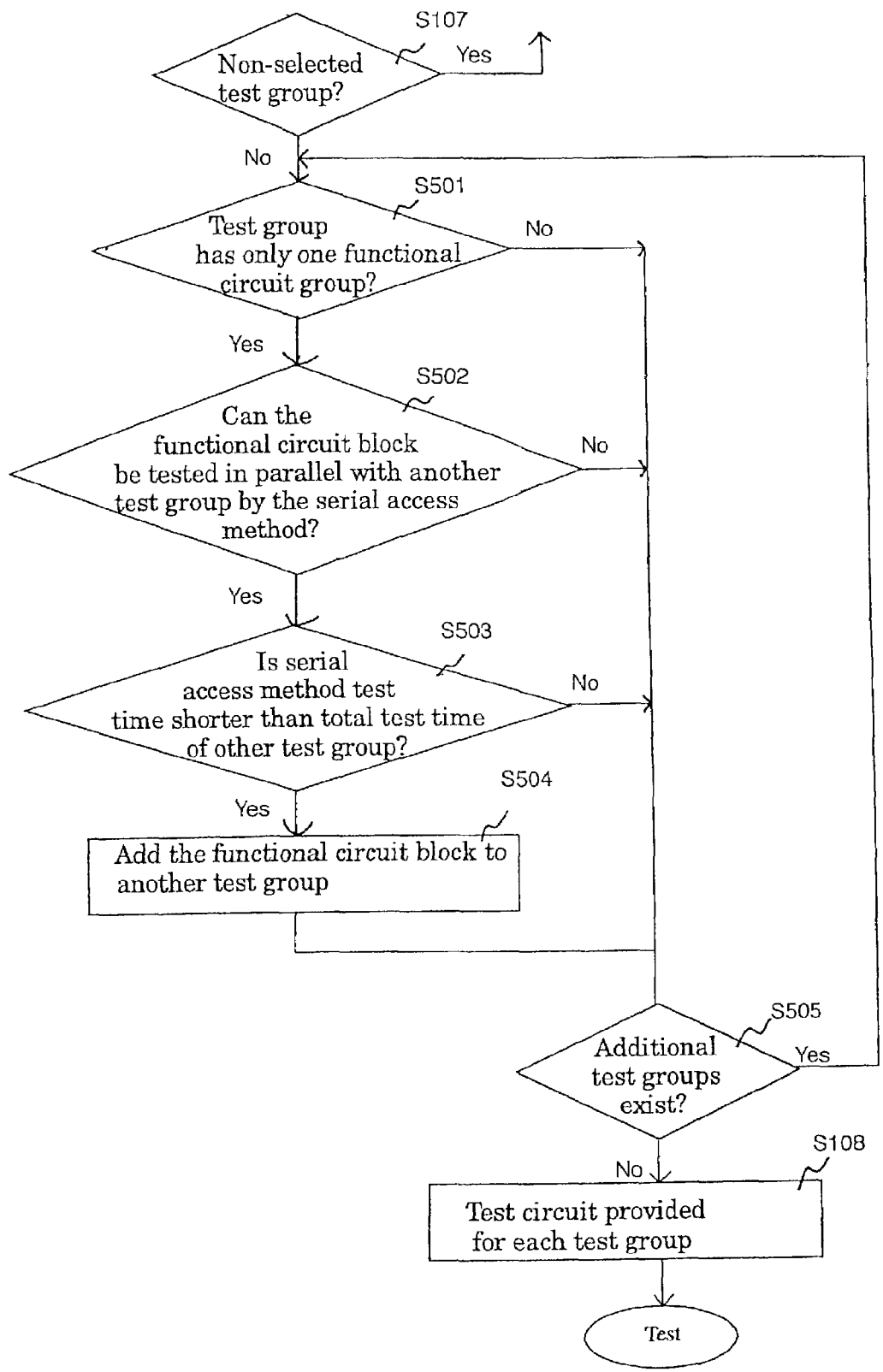
FIG. 5 is an operational diagram showing a method for testing functional circuit blocks according to a second preferred embodiment of the present invention.
Figure 6:
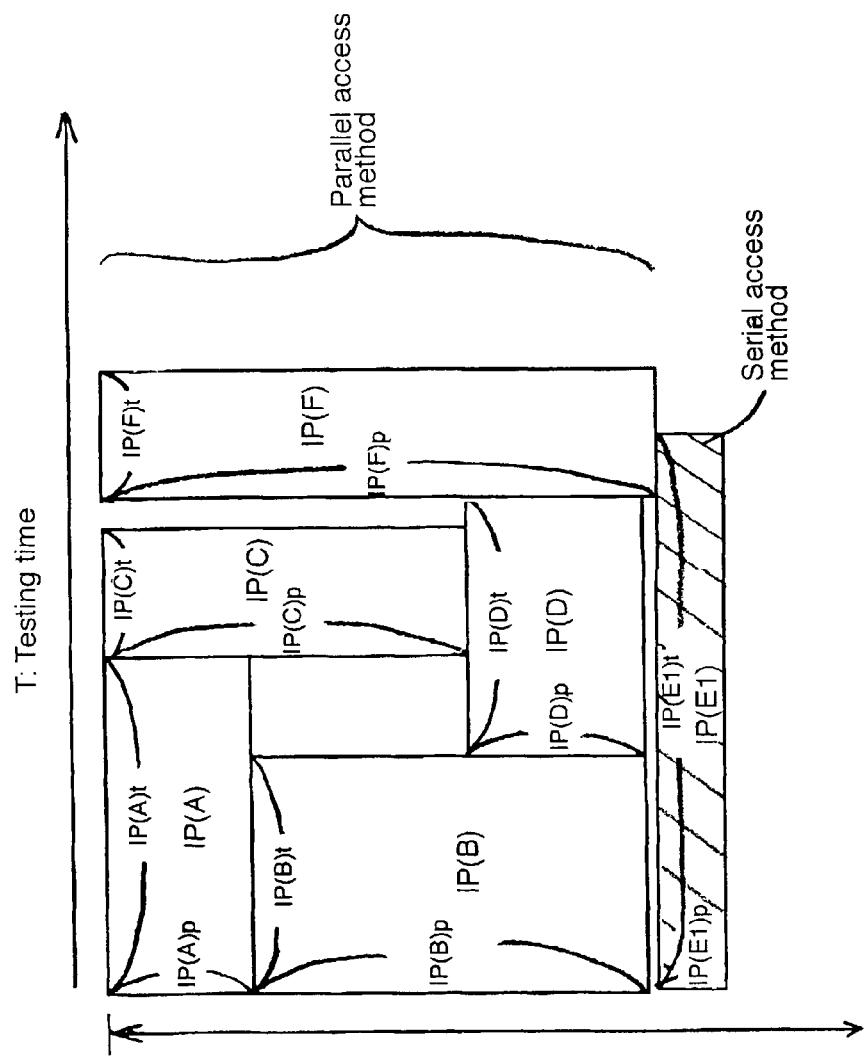
FIG. 6 is a block diagram showing the number of LSI pins and testing time according to the second preferred embodiment of the present invention.
Figure 7:
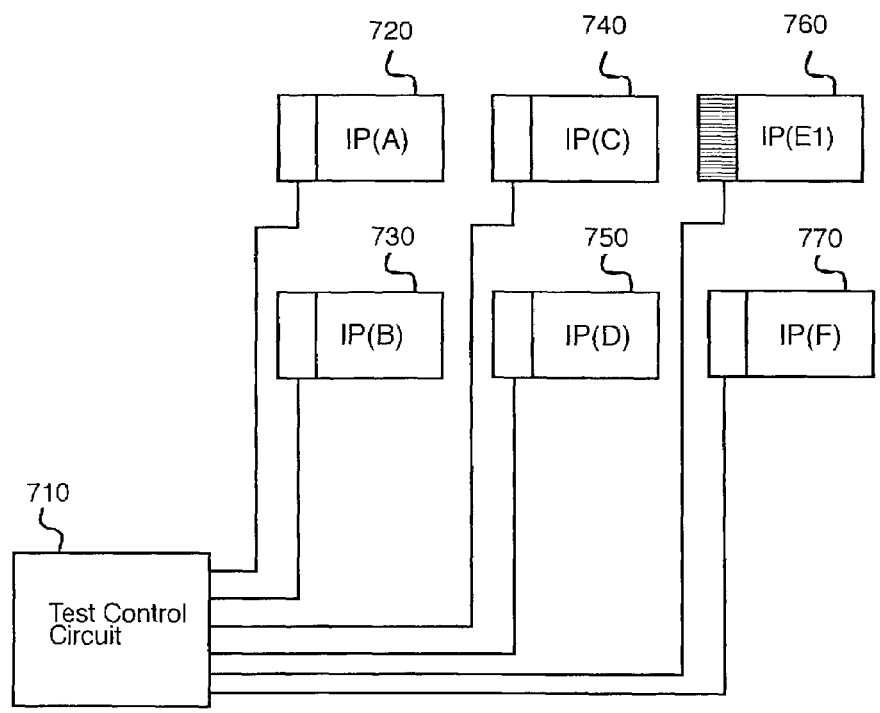
FIG. 7 is a block diagram showing a test circuit according to the second preferred embodiment of the present invention.
Figure 8:
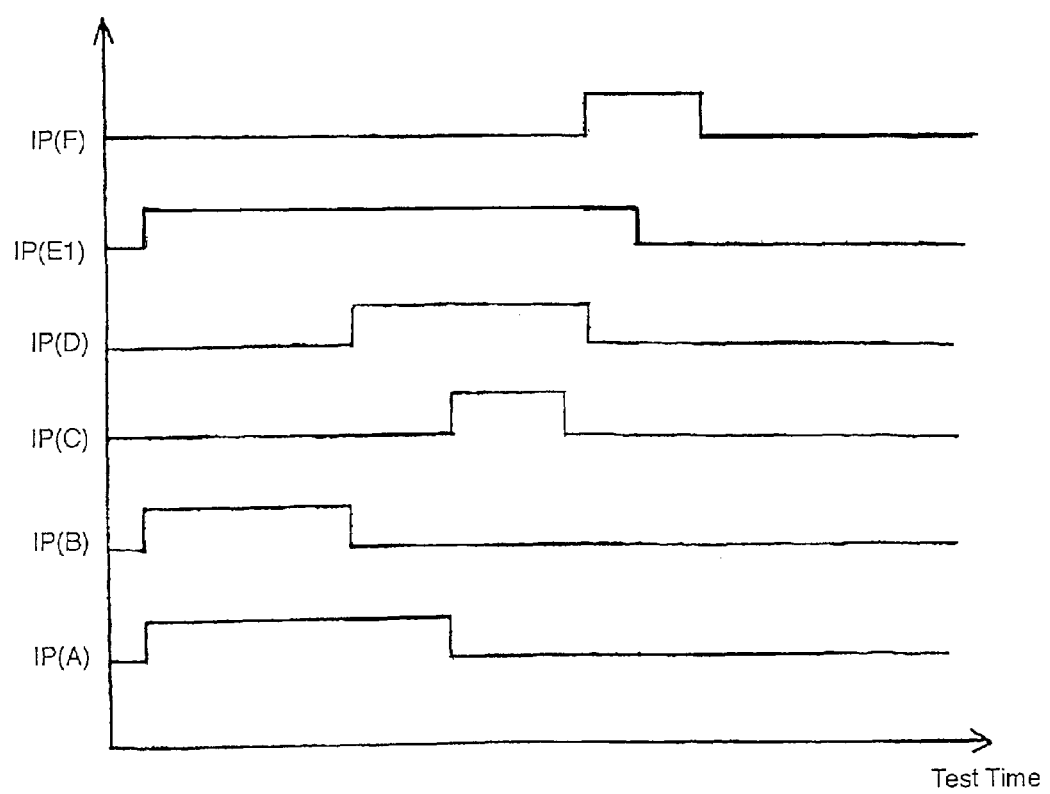
FIG. 8 is a timing chart showing necessary time for testing each functional circuit block shown in FIG. 6.

A method for testing the functional circuit blocks according to a second preferred embodiment of the present invention will be described with reference to FIGS. 5–8. FIG. 5 is an operational diagram showing the method for testing the functional circuit blocks according to the second preferred embodiment of the present invention. FIG. 6 is a block diagram showing the number of LSI pins and testing time according to the second preferred embodiment of the present invention. FIG. 7 is a block diagram showing a test circuit according to the second preferred embodiment of the present invention. FIG. 8 is a timing chart showing necessary time for testing each functional circuit block shown in FIG. 6. Like elements are given like or corresponding reference numerals in the first and second preferred embodiments. Thus, dual explanations of the same elements are avoided.

First, an operation of the method for testing the functional circuit blocks according to the second preferred embodiment of the present invention will be explained with reference to FIG. 5. The steps S501–S505 shown in FIG. 5 are added between step S107 and step S108 shown in FIG. 1.

In step S501, it is determined whether a test group comprises only one functional circuit block or not. If a test group comprises only one functional circuit block, step S502 is executed, and if not, step S505 is executed.

In step S502, whether or not the functional circuit block can be tested in parallel with test processes of another test group by the serial access method is determined, based on consideration of the number of pins of the system LSI. If it can be tested, step S503 is executed. If not, step S505 is executed.

In step S503, it is determined whether test time of the functional circuit block to be tested by the serial access method is shorter than total test time of the other test groups or not. If it is, step S504 is executed. If not, step S505 is executed. In step S504, the functional circuit block is added to another test group. Then, step S505 is executed.

In step S505, it is determined whether additional test groups exist or not. If so, step S501 is executed again. If not, step S108 is executed.

Next, an operation of the method for testing the functional circuit blocks according to the second preferred embodiment of the present invention will be explained with reference to FIG. 6 concretely.

In step S501, first, the 1st test group is checked. The 1st test group comprises two functional circuit blocks IP(A) and IP(B), so step S505 is executed. In step S505, additional test groups (2nd, 3rd, 4th test groups) exist, so step S501 is executed again. The process of the 2nd test group is omitted for the same reason as the 1st test group. In step S501 again, the 3rd test group is checked. The 3rd test group comprises only one functional circuit block IP(E), so step S502 is executed. It is determined that the 3rd test group can be tested by the serial access method in parallel with other test groups, so step S503 is executed. Test time of the functional circuit block IP(E) of the 3rd test group to be tested by the serial access method is shorter than total test time of the other test groups, so step S504 is executed. In step S504, the functional circuit block IP(E) of the 3rd test group is added to other test groups (1st, 2nd and 4th test groups) and is shown as IP(E1) in FIG. 6. In step S505, the 4th test group is checked, the 4th test group is checked in step S501 again. The 4th test group comprises only one functional circuit block IP(F), so step S502 is executed. In step S502, it is determined that the 4th test group can not be tested in parallel with another test groups, so step S505 is executed. In step S505, additional test group do not exist, so step S108 is executed.

In step S108, a test circuit is provided for each test group as shown in FIG. 7. The test circuit has a test control circuit 710 and the functional circuit blocks 720–770. The test control circuit 710 and the functional circuit blocks 720–770 are connected to each other by the control bus. Each functional circuit block 720–770 is controlled through the control bus by the test control circuit 710. In addition, the test control circuit 710 has a test access circuit and so on. As shown in FIG. 7, all functional circuit blocks except for the functional circuit block IP(E1) are tested by the parallel access method, the functional circuit block IP(E1) is tested by the serial access method. Returning to FIG. 7, the test process for the functional circuit blocks is executed.

In FIG. 8, each wave form shows the testing status of each functional circuit block. The rising part of the wave form shows the status of being tested. The falling part of the wave shows the status of not being tested. As shown in FIG. 8, the test process for the functional circuit blocks IP(A), IP(B) and IP(E1) are started at the same time. Next, immediately after the test process for the functional circuit block IP(B) is finished, the test process for the functional circuit block IP(D) is started. Next, immediately after the test process for the functional circuit block IP(A) is finished, the test process for the functional circuit block IP(C) is started. Next, immediately after the test process for the functional circuit blocks IP(C) and IP(D) is finished, the test process for the functional circuit block IP(F) is started. Therefore, total test time is the sum of IP(B)t, IP(D)t and IP(F)t. On the other hand, total test time of the conventional test method is the sum of IP(A)t, IP(D)t, IP(E)t and IP(F)t. Thus, total test time of the second preferred embodiment of the present invention is shorter than total test time of the conventional test method by the difference IP(A)t+IP(E)t−IP(B)t. In addition, total test time of the first preferred embodiment of the present invention is the sum of IP(B)t, IP(D)t, IP(E)t and IP(F)t. Therefore, total test time of the second preferred embodiment of the present invention is shorter than total test time of the first preferred embodiment by the difference IP(E)t.

As the method for testing the functional circuit blocks according the first preferred embodiment of the present invention, the method for testing the functional circuit blocks according to the second preferred embodiment of the present invention can start to test next test group without waiting for finishing all of test processes of previous test group. The method for testing the functional circuit blocks according to the second preferred embodiment of the present invention saves the time necessary for finishing all of the test processes of the previous test group. Therefore, the method for testing the functional circuit blocks according to the second preferred embodiment of the present invention reduces test time for the functional circuit blocks of the system LSI in comparison with the conventional method.

Furthermore, the method for testing the functional circuit blocks according to the second preferred embodiment of the present invention tests the functional circuit blocks using a combination of the parallel access method and the serial access method. Therefore, the method for testing the functional circuit blocks according to the second preferred embodiment of the present invention reduces test time for the functional circuit blocks of the system LSI in comparison with the method according to the first preferred embodiment of the present invention.

Figure 9:
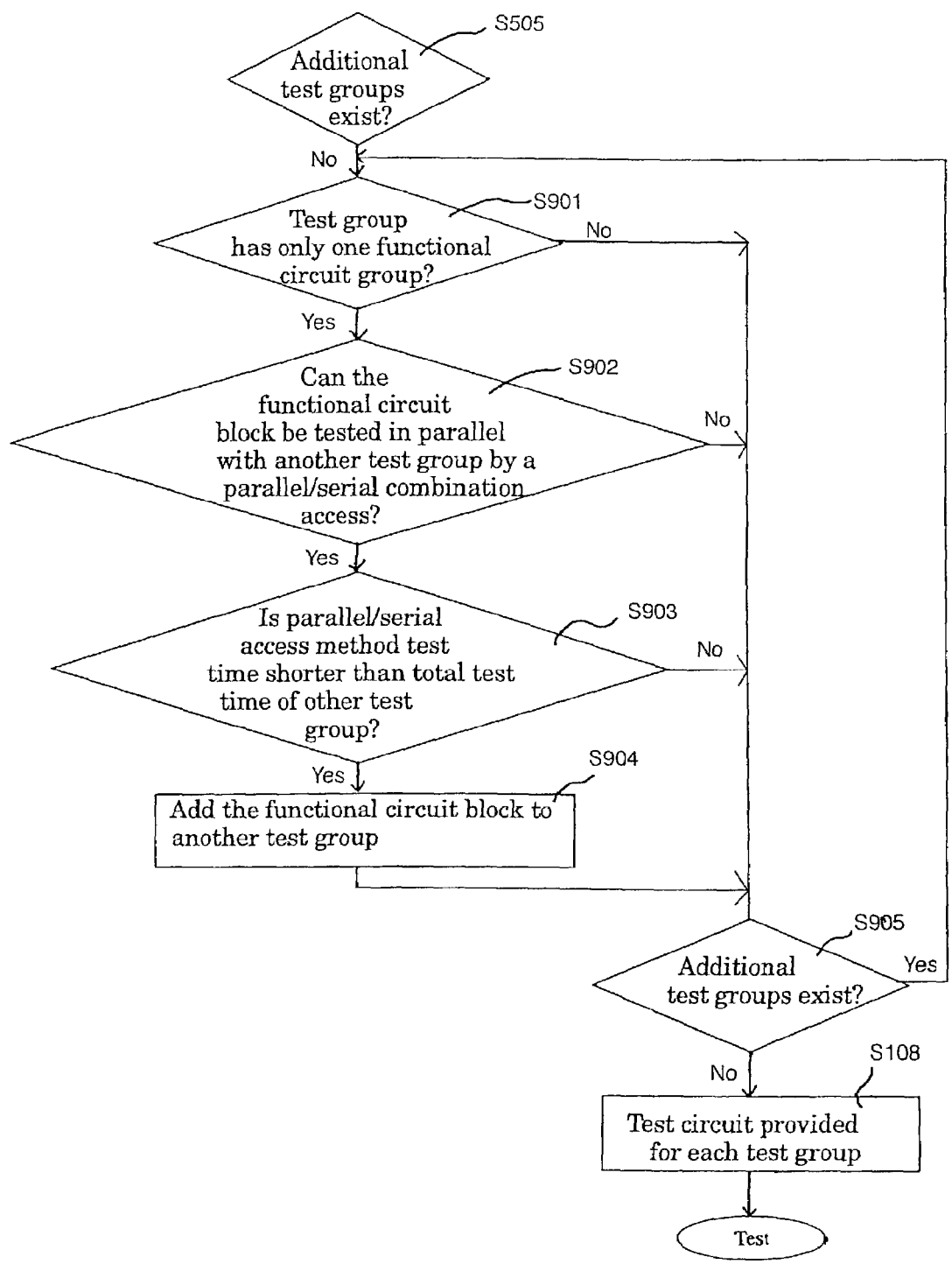
FIG. 9 is an operational diagram showing a method for testing functional circuit blocks according to a third preferred embodiment of the present invention.
Figure 10:
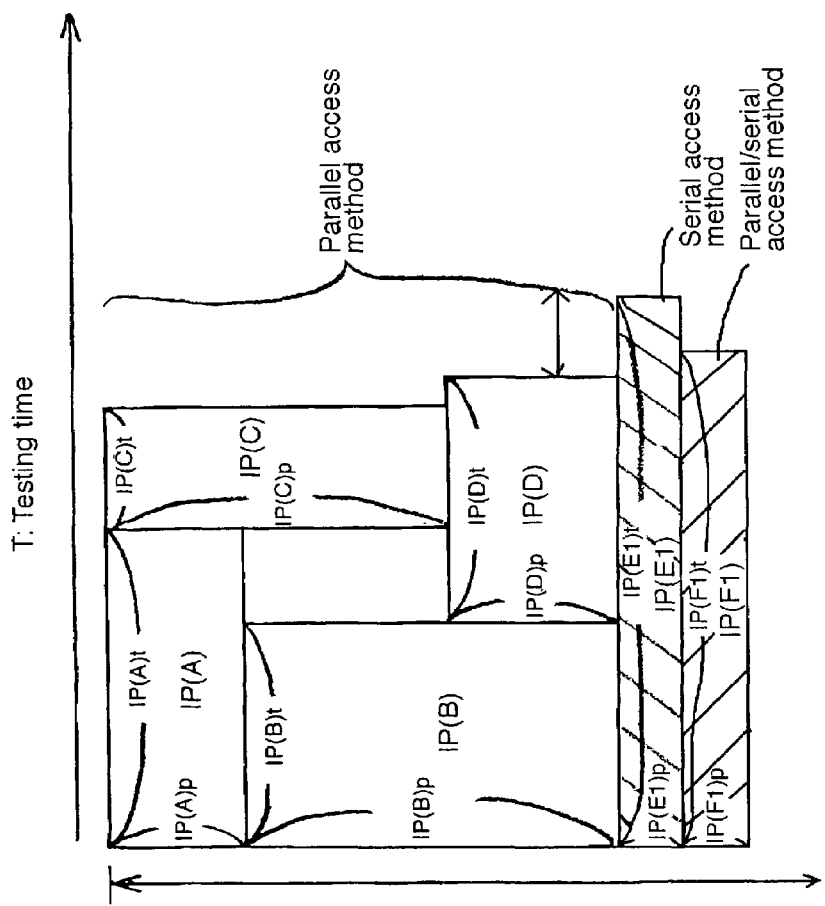
FIG. 10 is a block diagram showing the number of LSI pins and testing time according to the third preferred embodiment of the present invention.
Figure 11:
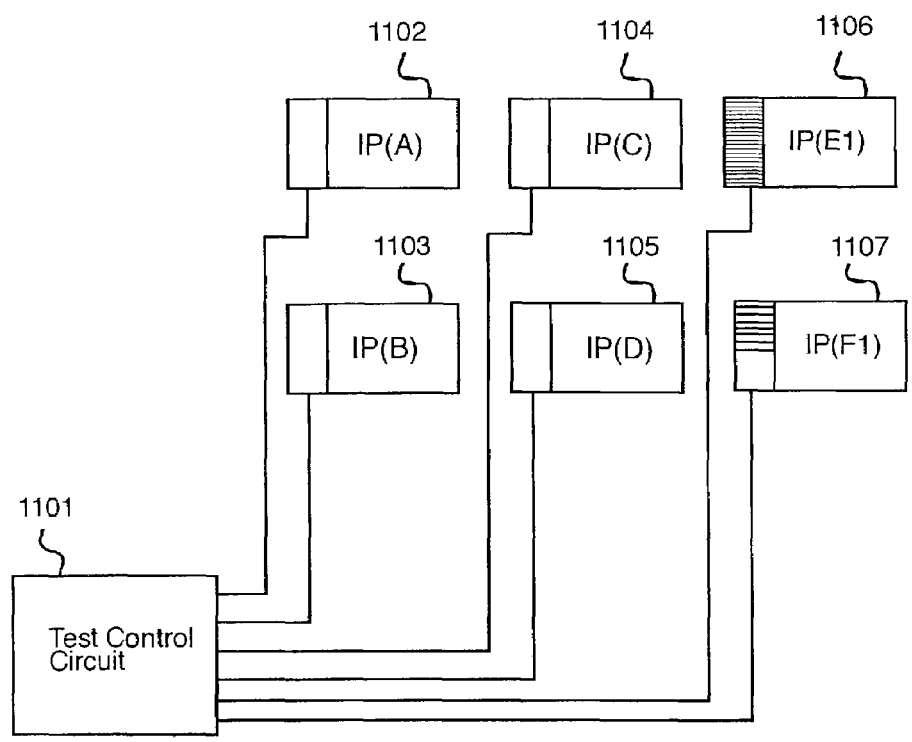
FIG. 11 is a block diagram showing a test circuit according to the third preferred embodiment of the present invention.
Figure 12:
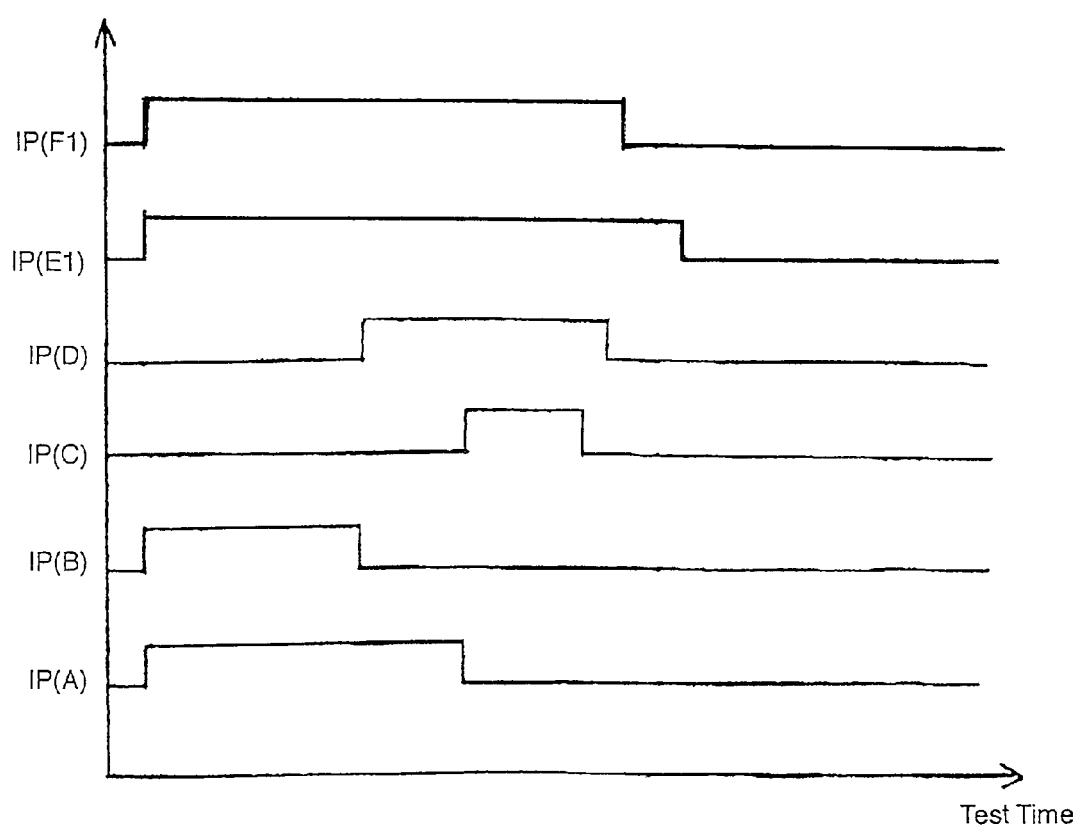
FIG. 12 is a timing chart showing necessary time for testing each functional circuit block shown in FIG. 10.

A method for testing the functional circuit blocks according to a third preferred embodiment of the present invention will be described with reference to FIGS. 9–12. FIG. 9 is an operational diagram showing the method for testing the functional circuit blocks according to the third preferred embodiment of the present invention. FIG. 10 is a block diagram showing the number of LSI pins and testing time according to the third preferred embodiment of the present invention. FIG. 11 is a block diagram showing a test circuit according to the third preferred embodiment of the present invention. FIG. 12 is a timing chart showing necessary time for testing each functional circuit block shown in FIG. 10. Like elements are given like or corresponding reference numerals in the above preferred embodiments. Thus, dual explanations of the same elements are avoided.

First, an operation of the method for testing the functional circuit blocks according to the third preferred embodiment of the present invention will be explained with reference to FIG. 9. The steps S901–S905 shown in FIG. 9 are added between step S505 and step S108 shown in FIG. 5.

In step S901, it is determined whether a test group comprises only one functional circuit block or not. If the test group has only one functional circuit block, step S902 is executed. If not, step S905 is executed.

In step S902, whether or not the functional circuit block can be tested in parallel with test processes of another test group by a parallel/serial combination access method is determined, based on consideration of the number of pins of the system LSI. If it can be tested, step S903 is executed. If not, step S905 is executed.

In step S903, it is determined whether or not test time of the functional circuit block to be tested by the parallel/serial combination access method is shorter than total test time of the other test groups. If it is, step S904 is executed. If not, step S905 is executed. In step S904, the functional circuit block is added to other test groups. Then, step S905 is executed.

In step S905, it is determined whether additional test groups exist or not. If additional test groups exist, step S901 is executed again. If not, step S108 is executed.

Next, an operation of the method for testing the functional circuit blocks according to the third preferred embodiment of the present invention will be explained with reference to FIG. 10 concretely.

In step S901, first, the 1st test group is checked. The 1st test group is comprised with two functional circuit blocks IP(A) and IP(B), so step S905 is executed. In step S905, the additional test groups (2nd, 3rd, 4th test groups) exist, so step S901 is executed again. The process of the 2nd test group is omitted for the same reason as the 1st test group. In step S901 again, the 3rd test group is checked. The 3rd test group is comprised with only one functional circuit block IP(E1), so step S902 is executed. As explained above in the preferred embodiment, the 3rd test group is decided to be tested by the serial access method, so step S905 is executed. After step S905, in step S901 again, the 4th test group is checked. The 4th test group is comprised with only one functional circuit block IP(F), so step S902 is executed. It is determined that the 4th test group can be tested by the parallel/serial combination access method in parallel with other test groups, so step S903 is executed. Test time of the functional circuit block IP(F) of 4th test group to be tested by the parallel/serial combination access method is shorter than total test time of the other test groups, so step S904 is executed. In step S904, the functional circuit block IP(F) of 4th test group is added to other test groups (1st, 2nd and 3rd test groups) and is shown as IP(F1) in FIG. 10. In step S905, the additional test groups do not exist, so step S108 is executed.

In step S108, a test circuit is provided for each test group as shown in FIG. 11. The test circuit has a test control circuit 1101 and the functional circuit blocks 1102–1107. The test control circuit 1101 and the functional circuit blocks 1102–1107 are connected with the control bus to each other. Each functional circuit block 1102–1107 is controlled through the control bus by the test control circuit 1101. In addition, the test control circuit 1101 has a test access circuit and so on. As shown in FIG. 11, the functional circuit blocks IP(A)–IP(D) are tested by the parallel access method, the functional circuit block IP(E1) is tested by the serial access method and the functional circuit block IP(F1) is tested by the parallel/serial combination method. Then, the test process for the functional circuit blocks is executed.

In FIG. 12, each wave form shows the testing status of each functional circuit block. The rising part of the wave form shows the status of being tested. The falling part of the wave shows the status of not being tested. As shown in FIG. 12, the test process for the functional circuit blocks IP(A), IP(B), IP(E1) and IP(F1) are started at the same time. Next, immediately after the test process for the functional circuit block IP(B) is finished, the test process for the functional circuit block IP(D) is started. Next, immediately after the test process for the functional circuit block IP(A) is finished, the test process for the functional circuit block IP(C) is started. Therefore, total test time is the sum IP(E1)t of IP(B)t, IP(D) and $\Delta\alpha$. On the other hand, total test time of the conventional test method is the sum of IP(A)t, IP(D)t, IP(E)t and IP(F)t. Thus, total test time of the third preferred embodiment of the present invention is shorter than total test time of the conventional test method by the difference IP(A)t+IP(E)t+IP(F)t−IP(B)−$\Delta\alpha$. In addition, total test time of the first preferred embodiment of the present invention is the sum of IP(B)t, IP(D)t, IP(E)t and IP(F)t. Therefore, total test time of the third preferred embodiment of the present invention is shorter than total test time of the first preferred embodiment by the difference IP(E)t+IP(F)t−$\Delta\alpha$. Furthermore, total test time of the second preferred embodiment of the present invention is the sum of IP(B)t, IP(D)t and IP(F)t. Therefore, total test time of the third preferred embodiment of the present invention is shorter than total test time of the second preferred embodiment by the difference IP(F)t−$\Delta\alpha$.

As the method for testing the functional circuit blocks according the first and second preferred embodiments of the present invention, the method for testing the functional circuit blocks according to the third preferred embodiment of the present invention starts to test next test group without waiting for finishing all of test processes of previous test group. The method for testing the functional circuit blocks according to the third preferred embodiment of the present invention saves the time needed to wait for finishing all of test processes of previous test group. Therefore, the method for testing the functional circuit blocks according to the third preferred embodiment of the present invention reduces test time for the functional circuit blocks of the system LSI in comparison with the conventional method.

Furthermore, the method for the method for testing the functional circuit blocks according to the third preferred embodiment of the present invention tests the functional circuit blocks using a combination of the parallel access method, the serial access method and parallel/serial combination access method. Therefore, the method for testing the functional circuit blocks according to the third preferred embodiment of the present invention reduces test time for the functional circuit blocks of the system LSI in comparison with the method according to the first and second preferred embodiments of the present invention.

Figure 13:
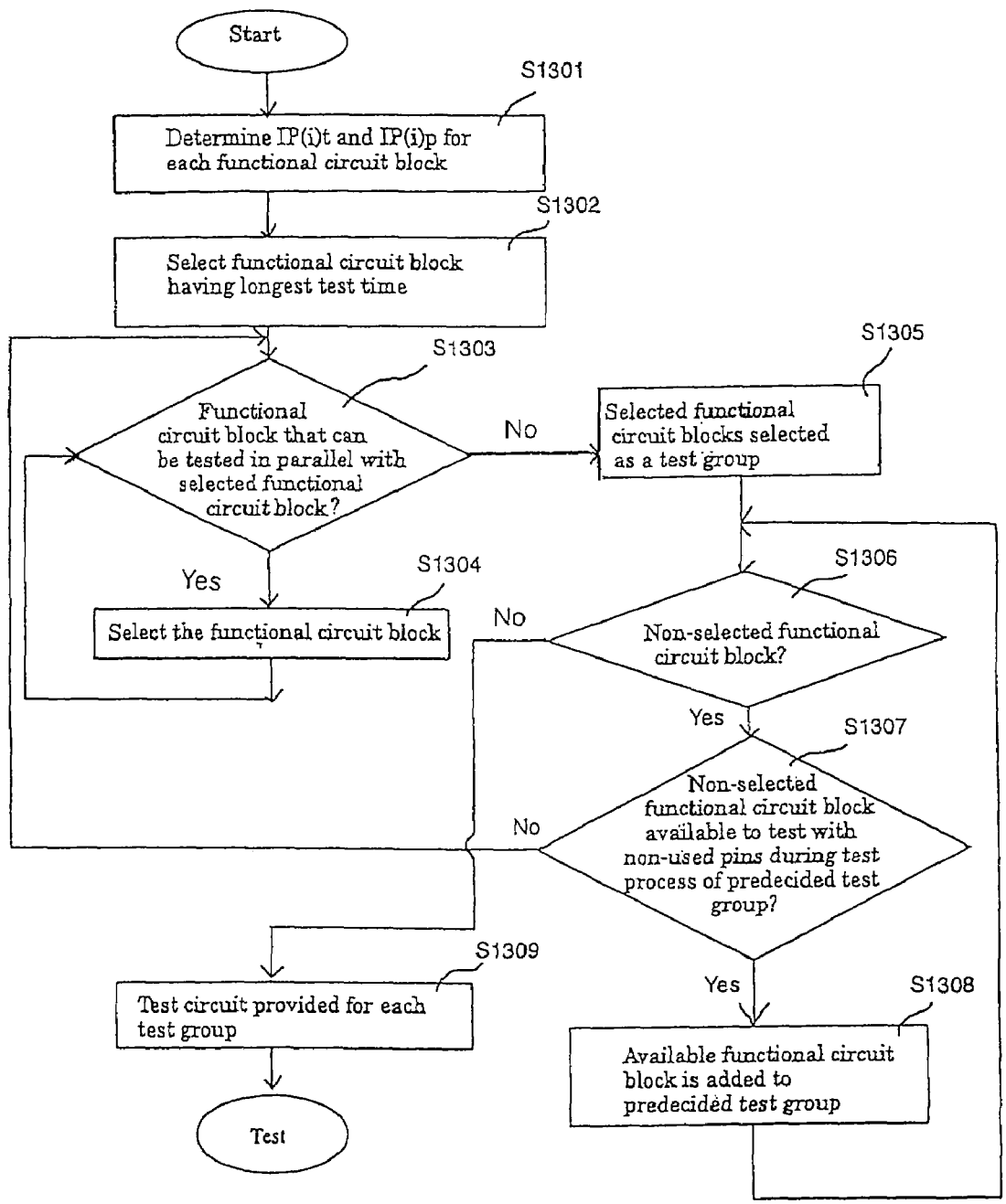
FIG. 13 is an operational diagram showing a method for testing functional circuit blocks according to a fourth preferred embodiment of the present invention.
Figure 14:
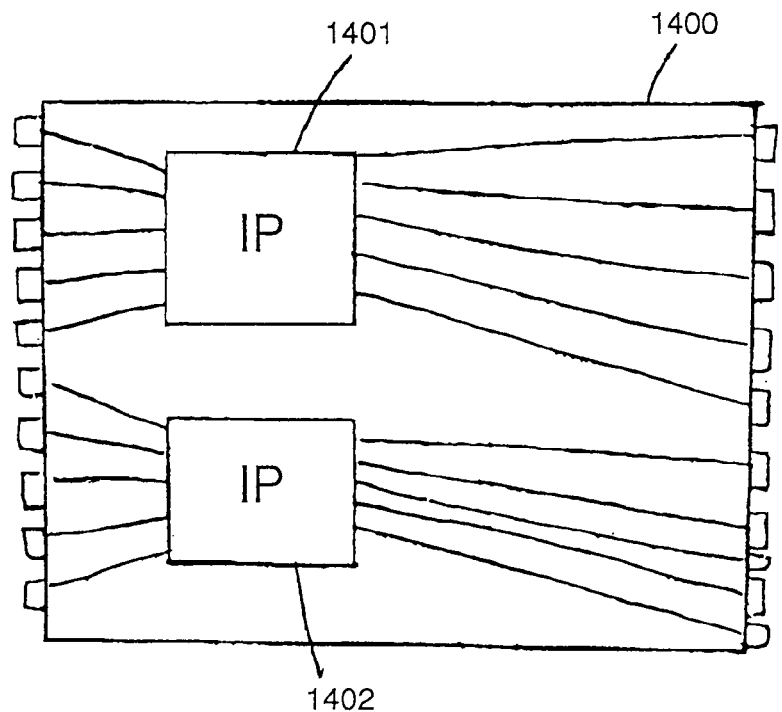
FIG. 14 is a block diagram for describing a parallel access method.
Figure 15:
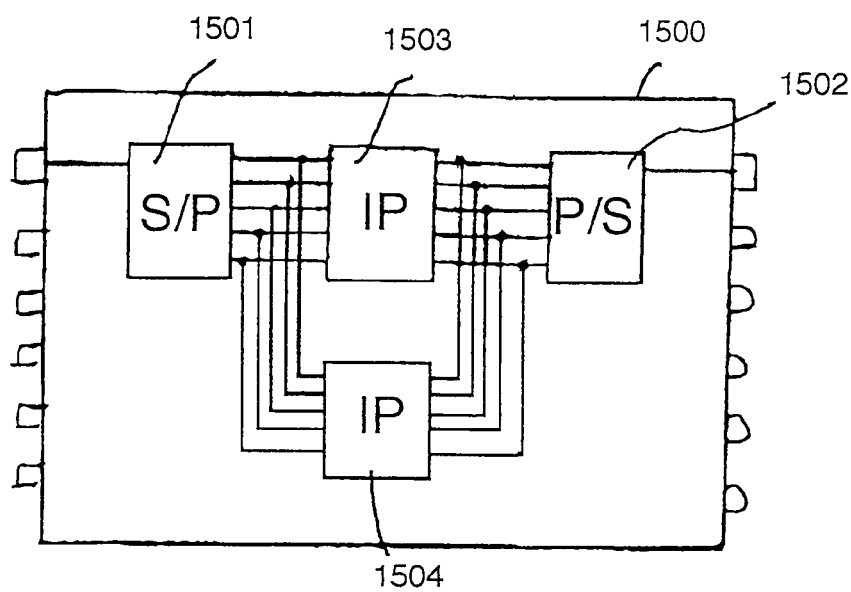
FIG. 15 is a block diagram for describing a serial access method.
Figure 16:
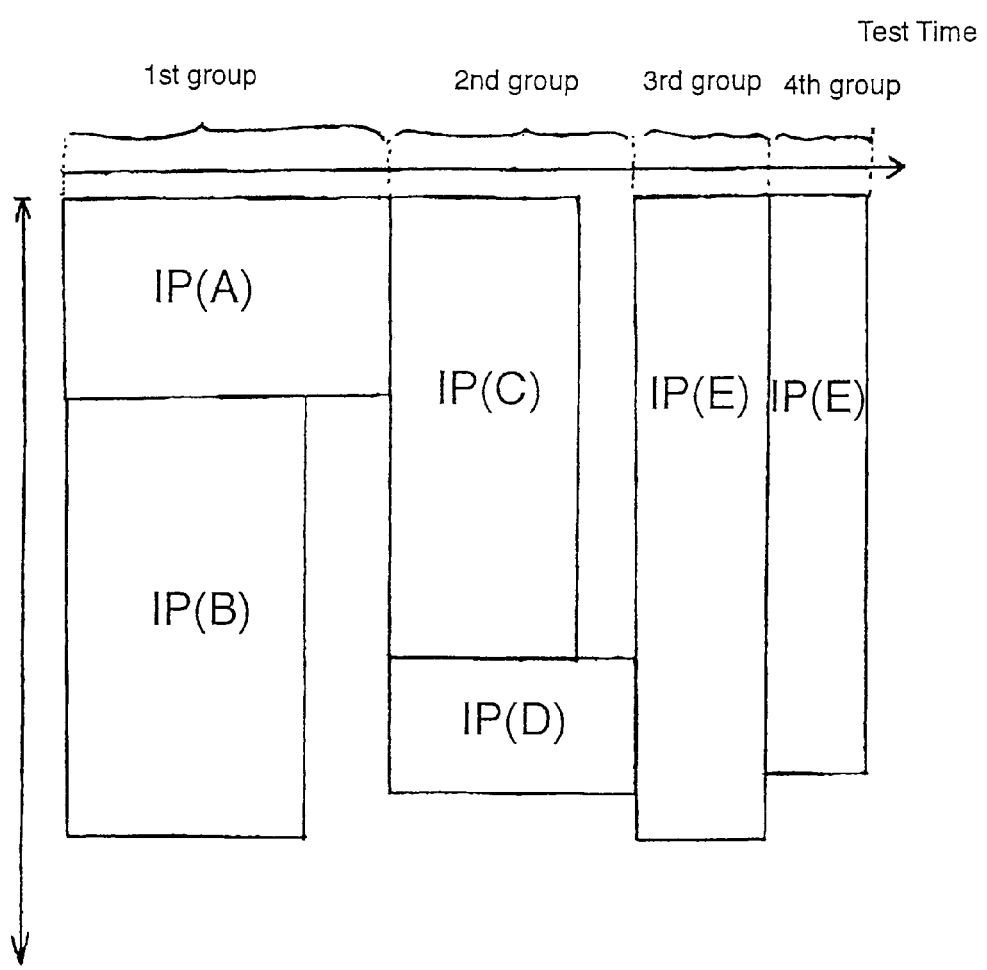
FIG. 16 is a block diagram showing the number of LSI pins and testing time according to a conventional method for testing functional circuit blocks.

A method for testing the functional circuit blocks according to a fourth preferred embodiment of the present invention will be described with reference to FIG. 13. FIG. 13 is an operational diagram showing the method for testing the functional circuit blocks according to the fourth preferred embodiment of the present invention. The method for testing the functional circuit blocks according to the fourth preferred embodiment of the present invention provides an improvement of the first preferred embodiment. The method for testing the functional circuit blocks according to the first preferred embodiment of the present invention decides all test groups and then adjusts the relationship among the test groups. However, the method for testing the functional circuit blocks according to the fourth preferred embodiment of the present invention adjusts the relationship between predecided test group and newly decided test groups every newly decided test group.

An operation of the method for testing the functional circuit blocks according to the fourth preferred embodiment of the present invention will be explained with reference to FIG. 13.

In step S1301, test time necessary for testing each functional circuit block and the number of pins of the system LSI necessary for testing each functional circuit block are calculated.

In step S1302, the functional circuit block of which test time is the longest test time among all functional circuit blocks, is selected.

In step S1303, it is determined whether or not there is a functional circuit block which can be tested in parallel with the functional circuit block selected in step S1302 among the non-selected functional circuit blocks out of consideration for the number of pins of the system LSI. If there is, step S1304 is executed, and the functional circuit block is selected. Steps S1303 and S1304 are repeated until there is no functional circuit block which can be tested in parallel with the functional circuit block selected in step S1302. If the decision in step S1303 is no, step S1305 is executed and the functional circuit blocks selected in steps S1302–S1304 are set as one test group. Next, step S1306 is executed.

In step S1306, it is determined whether or not there is a non-selected functional circuit block. If there is, step S1307 is executed. If not, step S1309 is executed.

In step S1307, it is determined whether or not there is a functional circuit block among the non-selected functional circuit blocks which is available for starting to test using the non-used pins of the system LSI at test process for a predecided test group. If there is, step S1308 is executed. If not, step S1303 is executed.

In step S1308, the functional circuit block is added to the predecided test group. Therefore, immediately after the test process for one functional circuit block in the predecided test group is finished, the test process for the added functional circuit block is started. Next, step S1306 is executed.

Step S1309 is equal to step S108. In step S1309, a test circuit is provided for each test group.

As the method for testing the functional circuit blocks according the first preferred embodiments of the present invention, a method for testing the functional circuit blocks according to a fourth preferred embodiment of the present invention starts to test a next test group without waiting for finishing all of test processes of previous test group. The method for testing the functional circuit blocks according to the fourth preferred embodiment of the present invention saves the time needed to wait for finishing all of test processes of previous test group. Therefore, the method for testing the functional circuit blocks according to the fourth preferred embodiment of the present invention reduces test time for the functional circuit blocks of the system LSI in comparison with the conventional method.

Furthermore, the method for testing the functional circuit blocks according to the fourth preferred embodiment of the present invention adjusts the relationship between predecided test group and newly decided test group for every newly decided test group.

While the preferred form of the present invention has been described, it is to be understood that modifications will be apparent to those skilled in the art without departing from the spirit of the invention.

The scope of the invention, therefore, is to be determined solely by the following claims.

What is claimed:

1. A method for testing a plurality of functional circuit blocks of a system LSI, the method comprising:
    dividing the plurality of functional circuit blocks into at least a first test group and a second test group, wherein the first test group is tested before the second test group; and
    starting to test one of the functional circuit blocks in the second test group, immediately after testing of one of the functional circuit blocks in the first test group is finished, while others of the functional circuit blocks in the first test group are being tested.

2. The method for testing a plurality of functional circuit blocks of a system LSI according to claim 1, wherein the one of the functional circuit blocks in the second test group is selected from the second test group based on a number of non-used pins of the system LSI.

3. The method for testing a plurality of functional circuit blocks of a system LSI according to claim 1, wherein the plurality of functional circuit blocks are divided into the test groups based on test time of each functional circuit block.

4. The method for testing a plurality of functional circuit blocks of a system LSI according to claim 3, wherein the first test group includes a functional circuit block having a longest test time from among the plurality of functional circuit blocks.

5. The method for testing a plurality of functional circuit blocks of a system LSI according to claim 4, wherein functional circuit blocks in the first test group other than the functional circuit block having the longest test time are selected based on a number of non-used pins of the system LSI.

6. The method for testing a plurality of functional circuit blocks of a system LSI according to claim 5, wherein the one of the functional circuit blocks in the second test group is selected from among the second test group based on a number of non-used pins of the system LSI.

7. The method for testing a plurality of functional circuit blocks of a system LSI according to claim 1, wherein one of the first and second test groups is tested by a parallel access method.

8. The method for testing a plurality of functional circuit blocks of a system LSI according to claim 1, wherein one of the first and second test groups is tested by a serial access method.

9. The method for testing a plurality of functional circuit blocks of a system LSI according to claim 1, wherein one of the first and second test groups is tested by a parallel/serial access method.

* * * * *